United States Patent
Jung (10) Patent No.: US 6,294,805 B1
(45) Date of Patent: *Sep. 25, 2001

(54) FERROELECTRIC MEMORY DEVICES INCLUDING CAPACITORS LOCATED OUTSIDE THE ACTIVE AREA AND MADE WITH DIFFUSION BARRIER LAYERS

(75) Inventor: Dong-jin Jung, Kyungki-do (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/869,704

(22) Filed: Jun. 5, 1997

(30) Foreign Application Priority Data

Jun. 7, 1996 (KR) .................................. 96-20359

(51) Int. Cl.⁷ .......................... H01L 29/76; H01L 29/94; H01L 31/062; H01L 31/113
(52) U.S. Cl. ........................ 257/295; 257/310; 257/908; 438/3; 438/240; 438/250; 438/393
(58) Field of Search .................................. 257/295, 310, 257/908; 438/240, 250, 393

(56) References Cited

U.S. PATENT DOCUMENTS

| | | | |
|---|---|---|---|
| 5,046,043 | * 9/1991 | Miller et al. ......................... | 365/145 |
| 5,122,923 | 6/1992 | Matsubara et al. .................. | 361/321 |
| 5,185,689 | 2/1993 | Maniar ................................ | 361/313 |
| 5,216,572 | * 6/1993 | Larson et al. ....................... | 361/313 |
| 5,330,931 | 7/1994 | Emesh et al. ....................... | 437/60 |
| 5,468,684 | * 11/1995 | Yoshimori et al. .................. | 438/253 |
| 5,474,955 | 12/1995 | Thakur ................................ | 437/173 |
| 5,475,248 | * 12/1995 | Takenaka ............................. | 257/295 |
| 5,481,490 | * 1/1996 | Watanabe et al. ................... | 365/145 |
| 5,491,102 | * 2/1996 | Desu et al. .......................... | 438/3 |
| 5,506,436 | * 4/1996 | Hayashi et al. ..................... | 257/351 |
| 5,554,559 | * 9/1996 | Wolters et al. ...................... | 257/295 |
| 5,578,867 | * 11/1996 | Argos, Jr. et al. ................... | 257/632 |
| 5,580,814 | * 12/1996 | Larson ................................. | 438/3 |

(List continued on next page.)

OTHER PUBLICATIONS

Notice to Submit Response, Korean App. No. 97–49758, Nov. 25, 1998.

Primary Examiner—Tom Thomas
Assistant Examiner—Howard Weiss
(74) Attorney, Agent, or Firm—Myers Bigel Sibley & Sajovec (57) ABSTRACT

Integrated circuit ferroelectric memory devices include a pair of spaced apart word lines which cross an elongated active region, a drain region in the active region between the pair of word lines, and a pair of source regions in the active region outside the pair of spaced apart word lines on opposite sides of the drain region. A pair of ferroelectric capacitors outside the elongated active region is also included, a respective one of which is adjacent a respective one of the pair of source regions. Each of the ferroelectric capacitors includes spaced apart first and second electrodes and a ferroelectric layer between them. A respective one of the first electrodes is electrically connected to a respective one of the pair of source regions. A pair of plate lines is electrically connected to a respective one of the second electrodes and a bit line is electrically connected to the drain region. Integrated circuit ferroelectric memory devices according to the invention may be formed by fabricating a field effect transistor in an integrated circuit substrate and forming a first electrode, a ferroelectric layer, a diffusion barrier layer and a second electrode on the substrate. A first patterned metal layer electrically connects the first electrode to the source region of the field effect transistor and also electrically contacts the drain region. A second patterned metal layer electrically contacts the second electrode.

17 Claims, 8 Drawing Sheets

U.S. PATENT DOCUMENTS

| | | | |
|---|---|---|---|
| 5,670,808 | * 9/1997 | Nishiori et al. | 257/310 |
| 5,689,126 | * 11/1997 | Takaishi | 257/306 |
| 5,716,875 | * 2/1998 | Jones, Jr. et al. | 438/3 |
| 5,719,416 | * 2/1998 | Yoshimori et al. | 257/295 |
| 5,721,700 | * 2/1998 | Katoh | 365/145 |
| 5,767,541 | 6/1998 | Hanagasaki | 257/295 |
| 5,801,410 | * 9/1998 | Kim | 257/295 |
| 5,945,348 | 8/1999 | Blalock et al. | 438/692 |
| 6,069,036 | 5/2000 | Kim | 438/238 |

* cited by examiner

FERROELECTRIC MEMORY DEVICES INCLUDING CAPACITORS LOCATED OUTSIDE THE ACTIVE AREA AND MADE WITH DIFFUSION BARRIER LAYERS

FIELD OF THE INVENTION

This invention relates to integrated circuit devices and fabrication methods therefor, and more particularly to integrated circuit memory devices and fabrication methods therefor.

BACKGROUND OF THE INVENTION

Ferroelectric thin films have been used in nonvolatile memory devices to form ferroelectric memory devices. Ferroelectric memory devices utilize the spontaneous polarization phenomenon of a ferroelectric material to store information. High speed read/write operations may be accomplished with ferroelectric memory devices compared to conventional Erasable and Programmable Read Only Memories (EPROM) or Electrically Erasable and Programmable Read Only Memories (EEPROM).

Moreover, if a ferroelectric thin film is used as a dielectric layer in a cell capacitor of a Dynamic Random Access Memory (DRAM), a refresh operation may not be required, which can thereby reduce the power consumption of the DRAM and can improve the speed thereof. A ferroelectric memory device can perform read and write operations using a single power supply voltage similar to a Random Access Memory (RAM). Accordingly, ferroelectric memory devices are referred to as Ferroelectric RAM (FRAM) devices.

FRAM devices may be classified into two categories based on the unit cells thereof. The first category includes devices having unit cells including a transistor in which the ferroelectric film is used as a gate insulating layer. The second category includes unit cells having an access transistor and a capacitor in which the ferroelectric film is used for the dielectric layer thereof.

A FRAM in the first category, including a ferroelectric film as a gate insulating layer in a transistor, may have operational problems. For example, a silicon dioxide layer may be generated at the interface between a silicon substrate and the ferroelectric film which functions as a gate insulator via a reaction between the silicon substrate and oxygen atoms. Moreover, it may be difficult to obtain high quality ferroelectric films due to the lattice constant difference or thermal expansion coefficient difference between the silicon substrate and the ferroelectric film.

For at least these reasons, FRAM devices of the second category have also been developed, in which the ferroelectric film is used as the dielectric layer of a cell capacitor. These devices may generally have a similar structure to a cell structure of a DRAM.

Figure 1:
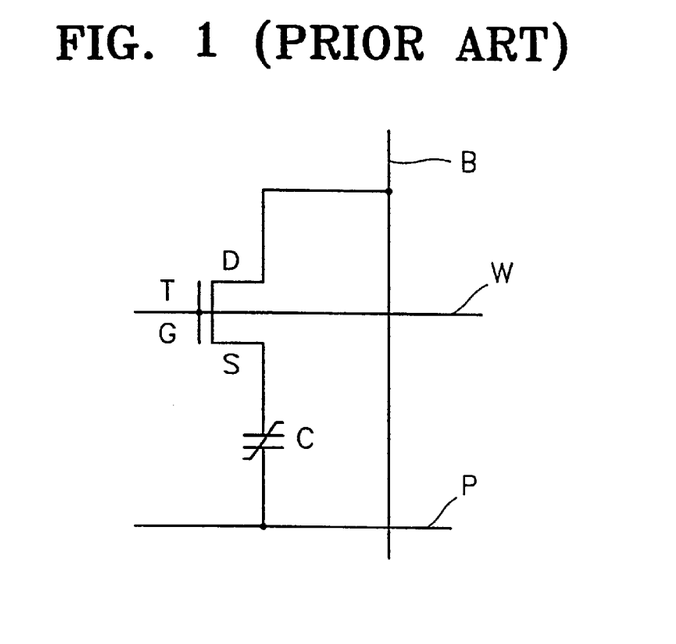
FIG. 1 is an equivalent circuit diagram of a unit cell of a conventional ferroelectric memory device.

FIG. 1 is an equivalent circuit diagram of a conventional unit cell of a FRAM in which the ferroelectric film is used as the dielectric layer of the cell capacitor. In the circuit configuration shown in FIG. 1, the gate electrode G of an NMOS transistor T is connected to a word line W. The drain region D is connected to a bit line B, and the source region S is connected to one electrode of a ferroelectric capacitor C. The other electrode of the ferroelectric capacitor C is connected to a plate line P.

Figure 2:
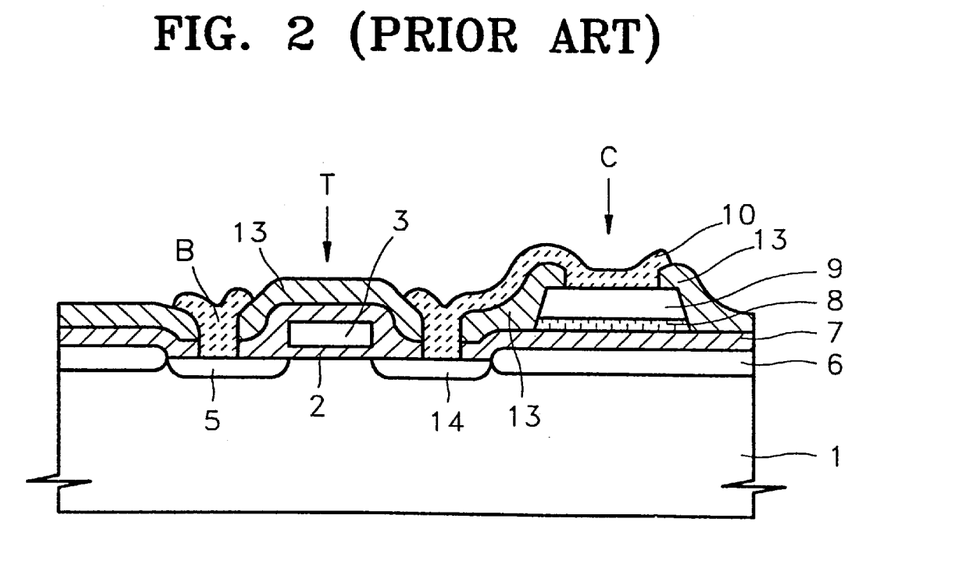
FIG. 2 is a cross-sectional view showing the cell structure of a conventional ferroelectric memory device.

FIG. 2 is a cross-sectional view of a conventional FRAM unit cell. As shown in FIG. 2, the conventional FRAM unit cell includes a semiconductor substrate 1 doped with P-type impurities, a field oxide layer 6, a gate electrode 3, a source region 14, a drain region 5, a first InterLayer Dielectric (ILD) film 7, a lower electrode 8, a ferroelectric layer 9, a second ILD film 13, an upper electrode 10 and a bit line B covering the drain region 5. The field oxide layer 6 is formed on the semiconductor substrate 1, to define an active region and an inactive region, and the gate electrode 3 is formed in the active region. The source and drain regions 14 and 5 are formed in the active region, at opposite sides of the gate electrode 3, by doping N-type impurity.

The first ILD film 7 exposes the source region 14 and the drain region 5, and covers the gate electrode 3 and the field oxide layer 6. The lower electrode 8 is formed of platinum (Pt) on a region of the first ILD film 7 formed on the field oxide layer 6 adjacent to the source region 14. The ferroelectric layer 9 on the lower electrode 8 is formed of PZT ($PbZr_xTi_{1-x}O_3$).

The second ILD film 13 is formed on the first ILD film 7 while exposing the ferroelectric layer 9, and the upper electrode 10 is formed of a metal wiring which connects the source region 14 exposed by the first ILD film 7 to the ferroelectric layer 9 exposed by the second ILD film 13. A borophosphosilicate glass (BPSG) layer is conventionally used for the first and second ILD films 7 and 13.

In FIG. 2, the gate electrode 3, the drain region 5 and the source region 14 form an access transistor T. The lower electrode 8, the ferroelectric layer 9 and the upper electrode 10 form a capacitor C. The lower electrode 8 acts as the plate line P of FIG. 1, and the gate electrode 3 acts as the word line W of FIG. 1.

In the conventional FRAM unit cell having the above-described structure, the lower electrode 8 made of Pt directly contacts the first ILD film 7 made of BPSG. The Pt layer may tend to lift off due to the weak adhesion between the Pt layer and the BPSG layer. Also, lead (Pb) or titanium (Ti) atoms in the ferroelectric layer 9 may pass through the Pt layer to diffuse into the first ILD film 7. Accordingly, the characteristics of the ferroelectric layer 9 may degrade, and thereby degrade the performance of the FRAM unit cell.

Finally, the first and second ILD films are generally etched to expose the source region 14 and the ferroelectric layer 9. As shown in FIG. 2, the ILD film formed on the ferroelectric layer 9 is thinner than the ILD films formed on the source region 14. Thus, in order to expose the source region 14 after the ferroelectric layer 9 is exposed, overetching may be required. Accordingly, the characteristics of the ferroelectric layer 9 may degrade due to the etch damage therein.

SUMMARY OF THE INVENTION

It is therefore an object of the present invention to provide ferroelectric memories which are capable of improved reliability, and methods of fabricating the same.

It is another object of the present invention to provide ferroelectric memories which can be fabricated using relatively simplified processing and methods of fabricating the same.

These and other objects are provided, according to the present invention, by an integrated circuit ferroelectric memory device which includes a pair of merged ferroelectric memory cells having a common bit line. In particular, integrated circuit ferroelectric memory devices according to the invention include an integrated circuit substrate including an elongated active region therein. A pair of spaced apart word lines cross the elongated active region. A drain region is located in the elongated active region between the pair of word lines. A pair of source regions is located in the elongated active region. A respective one of the source regions is outside the pair of spaced apart word lines, on opposite sides of the drain region.

A pair of ferroelectric capacitors is also included outside the elongated active region. A respective one of the ferroelectric capacitors is adjacent a respective one of the pair of source regions. Each of the ferroelectric capacitors comprise spaced apart first and second electrodes and a ferroelectric layer therebetween. A respective one of the first electrodes is electrically connected to a respective one of the pair of source regions.

A pair of plate lines is also included, a respective one of which is electrically connected to a respective one of the second electrodes. A bit line is also included, electrically connected to the drain region.

According to another aspect of the present invention, a diffusion barrier layer is included on each of the ferroelectric layers. The diffusion barrier layer prevents diffusion from the ferroelectric layers through the diffusion barrier layer. According to another aspect, an adhesion reinforcing layer is provided beneath the first electrodes.

When fabricated in an integrated circuit substrate such as semiconductor substrate, the pair of plate lines and the pair of word lines may extend parallel to each other and perpendicular to the bit line. The first and second electrodes preferably comprise materials selected from the group consisting of platinum, indium tin oxide, rhenium oxide, ruthenium oxide and molybdenum oxide. The adhesion reinforcing layer preferably comprises titanium, and the ferroelectric layers preferably comprise materials selected from the group consisting of PZT and PLZT.

According to another aspect, a pair of lower electrode wires respectively electrically connect a respective one of the first electrodes to a respective one of the pair of source regions. The pair of bit lines and the pair of lower electrode wires comprise a first metal layer. The first metal layer comprises material selected from the group consisting of a W/TiN/Ti layer and an Al/TiN/Ti layer. Similarly, the pair of plate lines preferably comprises a material selected from the group consisting of a W/TiN/Ti layer and an Al/TiN/Ti layer. Accordingly, a high performance reliable memory device may be included. It will also be understood that the diffusion barrier layer and adhesion reinforcing layers may be used in an integrated circuit ferroelectric device which includes a single cell rather than a pair of cells with a common drain and bit line.

Method aspects according to the present invention form a field effect transistor, including spaced apart source and drain regions and an insulated gate therebetween, in an integrated circuit substrate. A first interlayer dielectric layer is formed on the integrated circuit substrate, including on the field effect transistor. A first electrode is formed on the interlayer dielectric layer, adjacent the source region. A ferroelectric layer is formed on a portion of the first electrode.

A diffusion barrier layer is formed on the first electrode and on the ferroelectric layer on the portion of the first electrode. A second electrode is formed on the diffusion barrier layer, extending through the diffusion barrier layer to electrically contact the ferroelectric layer. A second interlayer dielectric layer is formed on the diffusion barrier layer and on the second electrode. A first patterned metal layer is formed which electrically connects the first electrode to the source region, and which also electrically contacts the drain region, through the first and second interlayer dielectric layers.

An inter-metal dielectric layer is formed on the second interlayer dielectric layer and on the first patterned metal layer. A second patterned metal layer is formed on the inter-metal dielectric layer, electrically contacting the second electrode through the inter-metal dielectric layer and the second interlayer dielectric layer. By simultaneously forming the first patterned metal layer which forms the lower electrode wires and the bit contact, simplified processing may be provided.

An adhesion reinforcing layer may be formed on the first electrode between the steps of forming a first electrode and forming a ferroelectric layer. Then, the ferroelectric layer is formed on a portion of the adhesion reinforcing layer. A second diffusion barrier layer may be formed on the diffusion barrier layer prior to forming the second interlayer dielectric layer. The second interlayer dielectric layer is then formed on the second diffusion barrier layer. The diffusion barrier layer and the second diffusion barrier layer may comprise titanium oxide. The remaining layers may comprise materials as already described above. Improved ferroelectric memory devices and fabrication methods therefor may thereby be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

Figure 3:
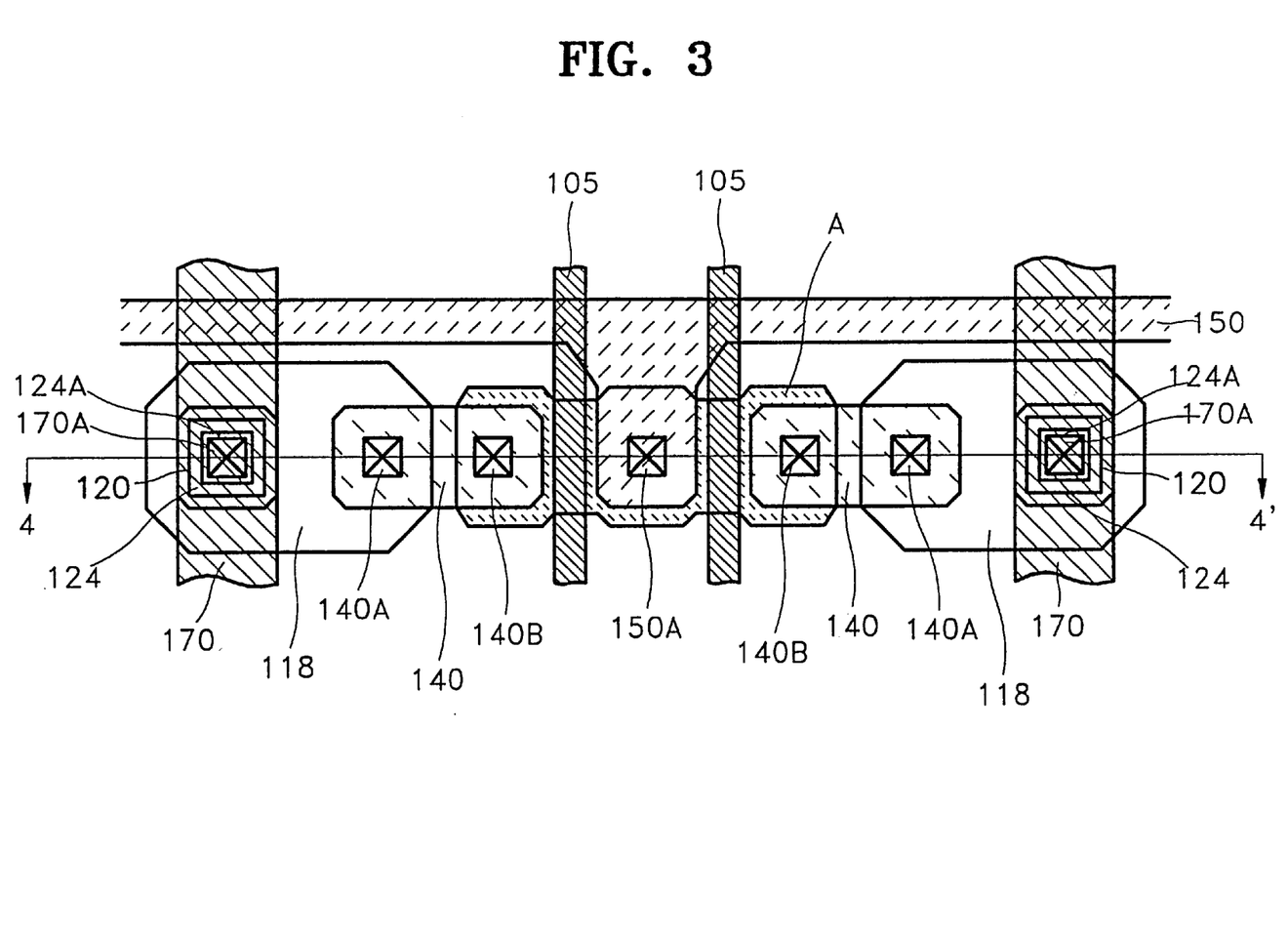
FIG. 3 is a cell layout diagram showing a portion of a cell array region of ferroelectric memory devices according to the present invention.

As shown in FIG. 3, in a cell array region of ferroelectric memory devices according to the present invention, a pair of cells are repeatedly arranged in a matrix. The pair of cells of ferroelectric memory devices according to the present invention includes an active region A having an elongated shape, which is defined by forming a device isolation layer as an inactive region in a predetermined region of an integrated circuit substrate such as a P-type semiconductor substrate. A pair of spaced apart word lines 105 are arranged parallel to each other and crossing the elongated active region A. A drain region is located in the active region between the pair of word lines 105. A pair of source regions is located in the active region, a respective one of which is outside the pair of spaced apart word lines on opposite sides of the drain region.

The word lines 105 act as a gate electrode and the drain and source regions are doped with N-type impurity. Also, the pair of word lines 105, the pair of source regions and the drain region form two access transistors which are serially connected and have a common drain region.

Still referring to FIG. 3, the pair of the cells in ferroelectric memory devices according to the present invention includes a pair of first or lower electrodes 118, a pair of ferroelectric layer patterns 120, a pair of second or upper electrode contacts 124A, a pair of second or upper electrodes 124, a pair of plate line contacts 170A, a pair of plate lines 170, a pair of first lower electrode wire contacts 140A, a pair of second lower electrode wire contacts 140B, a pair of lower electrode wires 140, a bit contact 150A and a bit line 150. The lower electrodes 118 are formed on inactive regions adjacent each source region. The ferroelectric layer patterns 120 are formed on a predetermined region of each lower electrodes 118, and the upper electrode contacts 124A expose a predetermined region of the ferroelectric layer patterns 120.

The upper electrodes 124 cover each upper electrode contact 124A to contact each ferroelectric layer pattern 120 via each upper electrode contact 124A. The plate line contacts 170A expose a predetermined region of each upper electrode 124. The plate lines 170 are arranged parallel to the word lines 105 while covering each plate line contact 170A to be connected to each upper electrode 124 via the plate line contacts 170A.

The first lower electrode wire contacts 140A expose a predetermined region of each lower electrode 118. The second lower electrode wire contacts 140B expose a predetermined region of each source region.

The lower electrode wires 140 connect each source region to each adjacent lower electrode via the first lower electrode wire contacts 140A and the second lower electrode wire contacts 140B.

The bit contact 150A exposes a predetermined region of the drain regions. Also, the bit line 150 extends perpendicular to the word lines 105 while covering each bit contact 150A to be connected to each drain region via the bit contact 150A.

Figure 4:
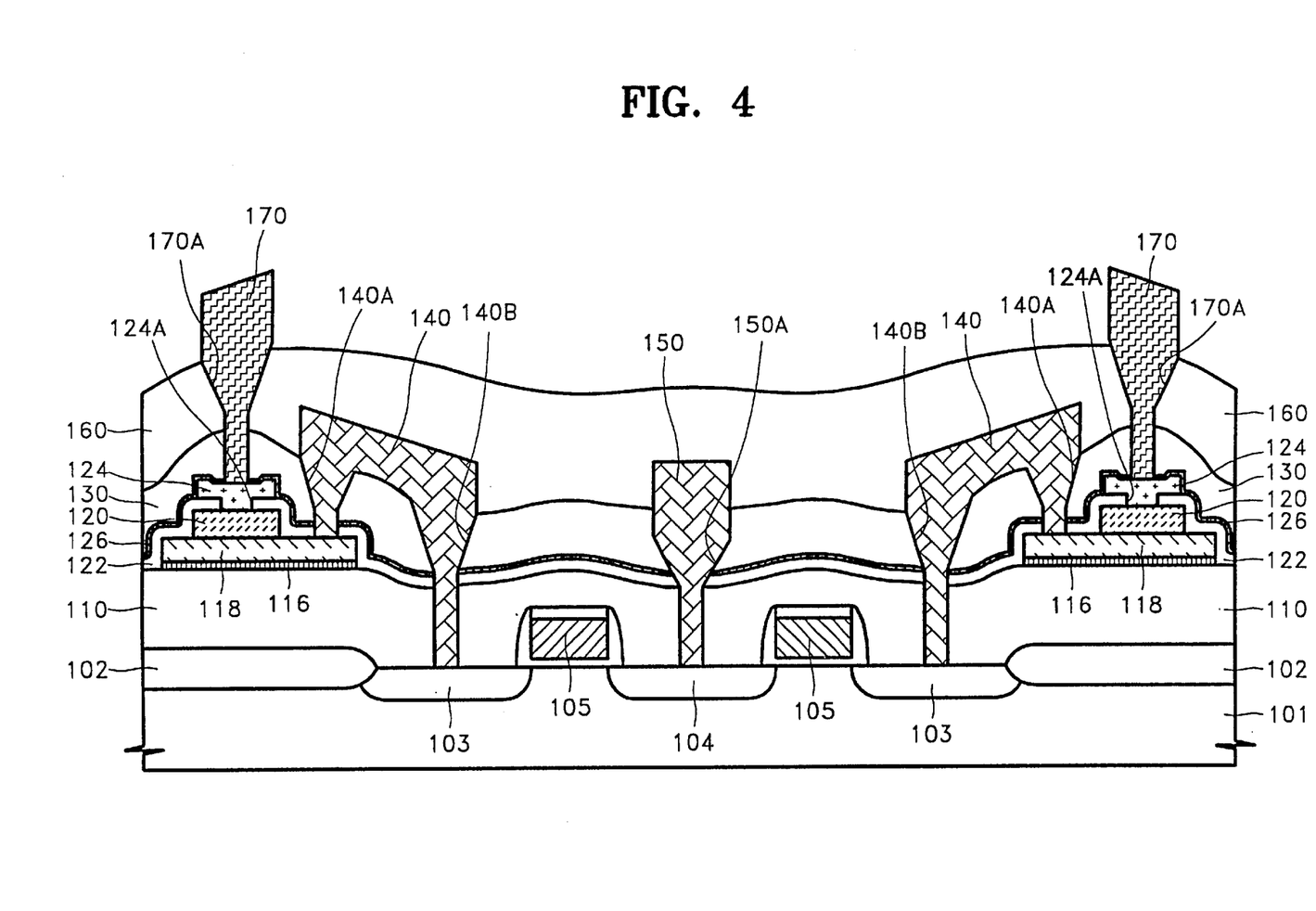
FIG. 4 is a cross-sectional view of the cell of ferroelectric memory devices, taken along the line 4-4' of FIG. 3.

FIG. 4 is a cross-sectional view of a cell of the ferroelectric memory device fabricated using masks according to the layout of FIG. 3. Referring to FIG. 4, a pair of cells of ferroelectric memory devices according to the present invention includes an active region and an inactive region which are defined by forming an isolation layer 102 in a predetermined region of an integrated circuit substrate such as a P-type semiconductor substrate 101. A gate insulation layer is located on the active regions. A pair of word lines 105 extend parallel to each other, crossing a predetermined region on the gate insulation layer. A drain region 104 is formed by doping an N-type impurity into the active region between the pair of word lines 105. A pair of source regions 103 is formed by doping the N-type impurity in the active regions adjacent the drain region 104. The pair of word lines 105, the drain region 104 and the pair of source regions 103 form a pair of access transistors which are connected serially and have a common drain region 104.

The pair of the cells of the ferroelectric memory device also includes a first ILD film 110 on the pair of access transistors and on the isolation layer 102 to expose a predetermined region of the drain region 104 and predetermined regions of each source region 103. A lower electrode 118 is included on a predetermined region of the isolation layer 102 adjacent each source region 103. A ferroelectric layer pattern 120 is included on a predetermined region of the lower electrode 118.

A first diffusion barrier layer 122 is included on the first ILD film 110, on the lower electrode 118 and on the ferroelectric layer pattern 120 to expose a predetermined region of the ferroelectric layer pattern 120 and a predetermined region of the lower electrode 118. An upper electrode 124 is included on each exposed ferroelectric layer pattern 120. A second diffusion barrier layer 126 is included on the first diffusion barrier layer 122 and the upper electrode 124 to expose a predetermined region of the upper electrode 124. A second ILD film 130 is included on the second diffusion barrier layer 126. The lower electrode 118 is formed of material selected from the group consisting of a platinum (Pt) layer, an indium tin oxide (ITO) layer, a rhenium oxide ($ReO_2$) layer, a ruthenium oxide ($RuO_2$) layer and molybdenum oxide ($MoO_3$) layer.

An adhesion reinforcing layer 116, e.g., a titanium (Ti) layer, may be interposed between the lower electrode 118 and the first ILD film 110 to improve adhesion between the lower electrode 118 and the first ILD film 110. Also, preferably, the ferroelectric layer pattern 120 is formed of a PZT layer or PLZT layer, and the upper electrode 124 is formed of the same material as that of the lower electrode 118. Also, preferably, the first and second diffusion barrier layers 122 and 126 are formed of titanium oxide ($TiO_2$) layers of 400~600 Å thickness and 200~300 Å thickness respectively, to prevent the diffusion of lead (Pb) or Ti from the ferroelectric layer pattern 120 through the first and second diffusion barrier layers.

The pair of the cells of the ferroelectric memory device also includes a pair of lower electrode wires 140 made of a first metal layer such as Al/TiN/Ti layer or W/TiN/Ti layer in order to connect each source region 103 to each lower electrode 118. A bit line 150 is formed of the same material layer as the first metal layer to contact the exposed drain region 104. An inter-metal dielectric film 160 is included on the bit line 150 made of the first metal layer, on the pair of lower electrode wires 140 and on the second ILD film 130. A pair of plate lines 170 contact each exposed upper electrode 124. The plate line 170 is formed of a second metal layer which is made of the same material as that of the first metal layer.

As described above, according to ferroelectric memory devices of the present invention, the lower electrode is independently formed in each cell, and lifting-off of the lower electrode can be prevented. In particular, the ferroelectric memory device includes an adhesion reinforcing layer beneath the lower electrode, thereby further improving the adhesion between the lower electrode and the first ILD film In addition, a diffusion barrier layer is interposed between the ferroelectric layer pattern and the second ILD film to prevent the diffusion of Pb or Ti out of the ferroelectric layer pattern, so that deterioration of the performance of the ferroelectric layer pattern is prevented.

Figure 5:
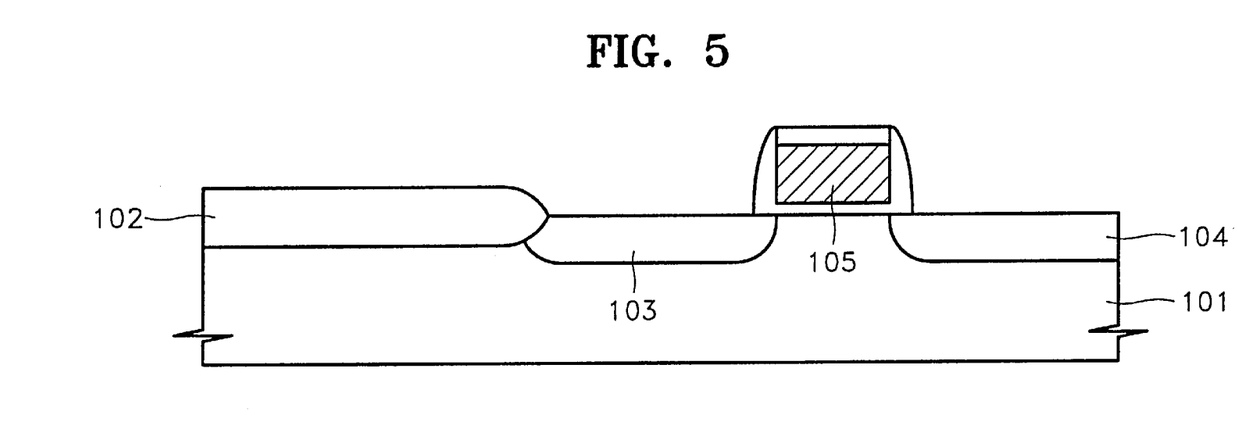
FIGS. 5 through 10 are cross-sectional views illustrating methods for fabricating ferroelectric memory devices according to a preferred embodiment of the present invention.

FIGS. 5 through 10 are cross-sectional views illustrating methods for fabricating a cell of a ferroelectric memory device shown in FIG. 4 according to the present invention. Referring to FIG. 5, a field effect transistor is formed in an integrated circuit substrate. In particular, a word line 105 (gate electrode) is formed on a semiconductor substrate 101 in which an active region and an inactive region are defined by an insulation layer 102 for isolation. An N-type source region 103 and a drain region 104 are formed therein.

Figure 6:
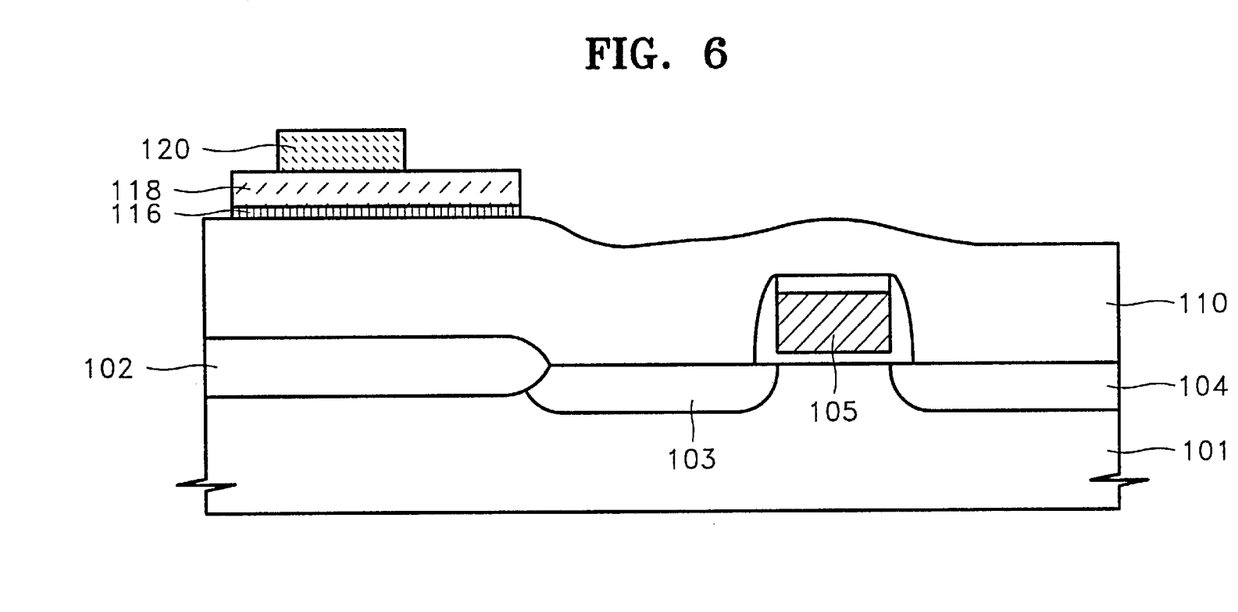

Referring to FIG. 6, an oxide layer comprising BPSG is deposited on the entire surface of the structure including the word line 105, the source region 103 and the drain region 104, using a chemical vapor deposition (CVD), and then reflowed to form a first ILD film 110. Then, an adhesion reinforcing layer such as Ti layer, a conductive material layer such as Pt layer for forming the lower electrode of a ferroelectric capacitor, and a ferroelectric layer such as PZT layer, are sequentially deposited on a predetermined region of the first ILD film 110. The resultant structure is sequentially patterned, thereby forming a ferroelectric layer pattern 120, a lower electrode 118 and an adhesion reinforcing layer 116.

The adhesion reinforcing layer 116 is formed to reinforce the adhesion between the lower electrode 118 and the first ILD film 110. The adhesion reinforcing layer may be omitted. According to the present embodiment, the adhesion reinforcing layer 116 is formed by depositing Ti on the first ILD film 110 to several hundred Ångstroms thickness, e.g., about 300 Å thickness, using sputtering. Also, the lower electrode 118 is formed by depositing a metal or conductive oxide material to about 2,700 Å thickness using sputtering. The lower electrode 118 may be formed of material selected from the group consisting of Pt, ITO, $ReO_2$, $RuO_2$ and $MoO_3$. Also, the ferroelectric layer pattern 120 may be formed by depositing PZT ($PbZr_xTi_{1-x}O_3$) or PLZT (PZT doped with lanthanum (La)) using a sol-gel method, sputtering method or CVD method.

Figure 7:
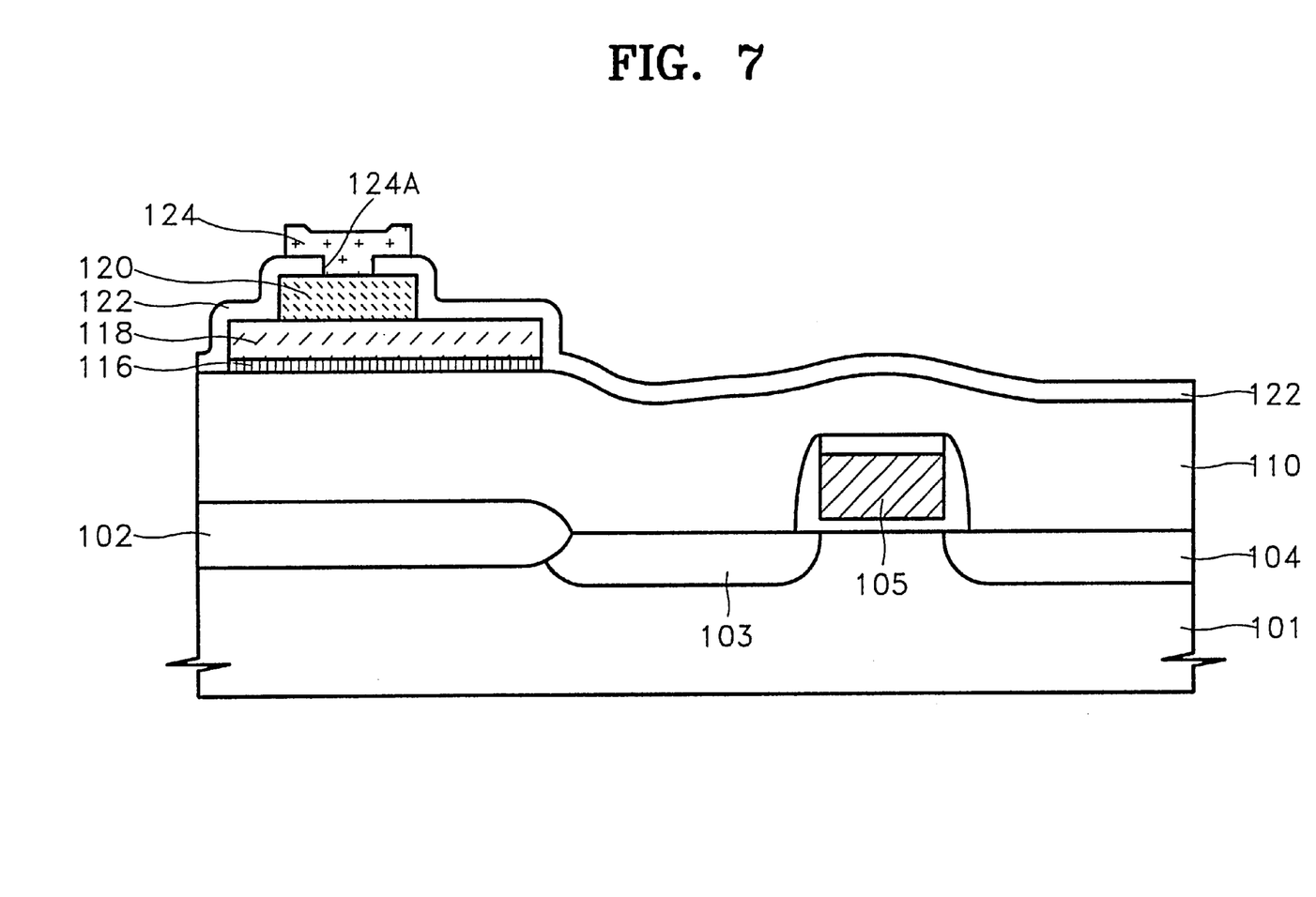

Referring to FIG. 7, a diffusion barrier layer, e.g., a $TiO_2$ layer, is formed on the entire surface of the resultant structure having the lower electrode 118, to several hundred Angstroms thickness, e.g., about 500 Å, using sputtering. Then, a contact hole 124A which exposes part of the ferroelectric layer pattern 120 is formed, resulting in a first diffusion barrier layer 122 having the contact hole 124A.

The first diffusion barrier layer 122 prevents the diffusion of the ferroelectric material included in the ferroelectric layer pattern 120 into the ILD films and also reinforces the adhesion between the ferroelectric layer pattern 120 and the upper electrode to be formed subsequently. The first diffusion barrier layer 122 may be patterned to cover only the region of the lower electrode 118 and the ferroelectric layer pattern 120. Accordingly, this can prevent the first diffusion barrier layer 122 from functioning as a path for leakage current.

Thereafter, in the same manner as the formation of the lower electrode 118, a conductive material layer for forming the upper electrode is deposited on the structure having the first diffusion barrier layer 122 using a sputtering method, and then patterned to form an upper electrode 124. The upper electrode 124 may be formed of at least one material selected from the group consisting of Pt, ITO, $ReO_2$, $RuO_2$ and $MoO_3$, like the lower electrode 118.

Figure 8:
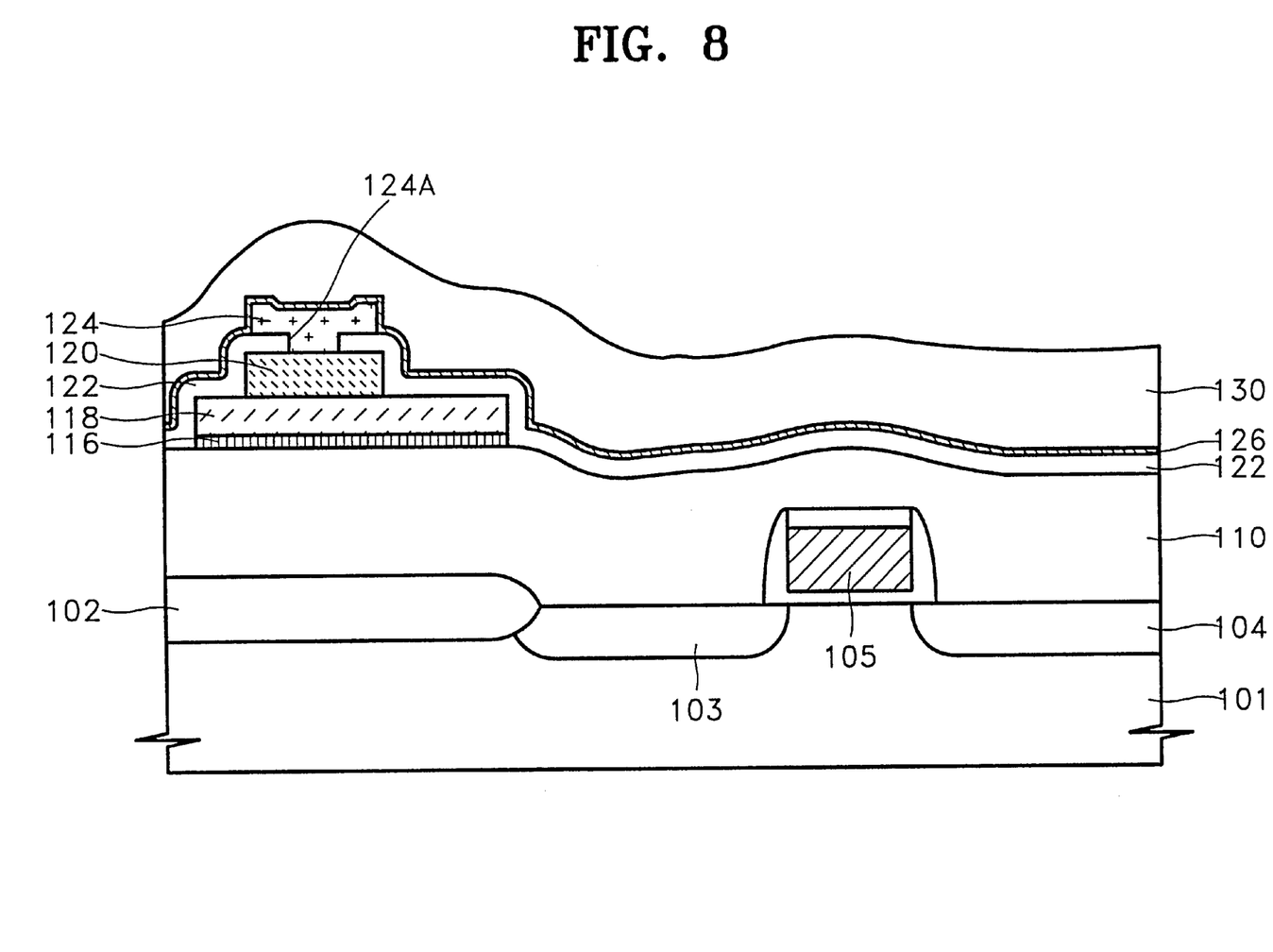

Referring to FIG. 8, a diffusion barrier layer, e.g., a $TiO_2$ layer, is formed on the entire surface of the resultant structure having the upper electrode 124 to several hundred Ångstroms thickness, e.g., about 250 Å, using a sputtering method, thereby resulting in a second diffusion barrier layer 126. The second diffusion barrier layer 126 acts like the first diffusion barrier layer 122, and the formation of the second diffusion barrier layer 126 may be omitted. Also, the second diffusion barrier layer 126 may be patterned to cover only the region of the lower electrode 118, the ferroelectric layer pattern 120 and the upper electrode 124, in the same manner as the first diffusion barrier layer 122. Then, an oxide layer made of BPSG is formed on the entire surface having the second diffusion barrier layer 126 using a CVD method and then reflowed to form a second ILD film 130.

Figure 9:
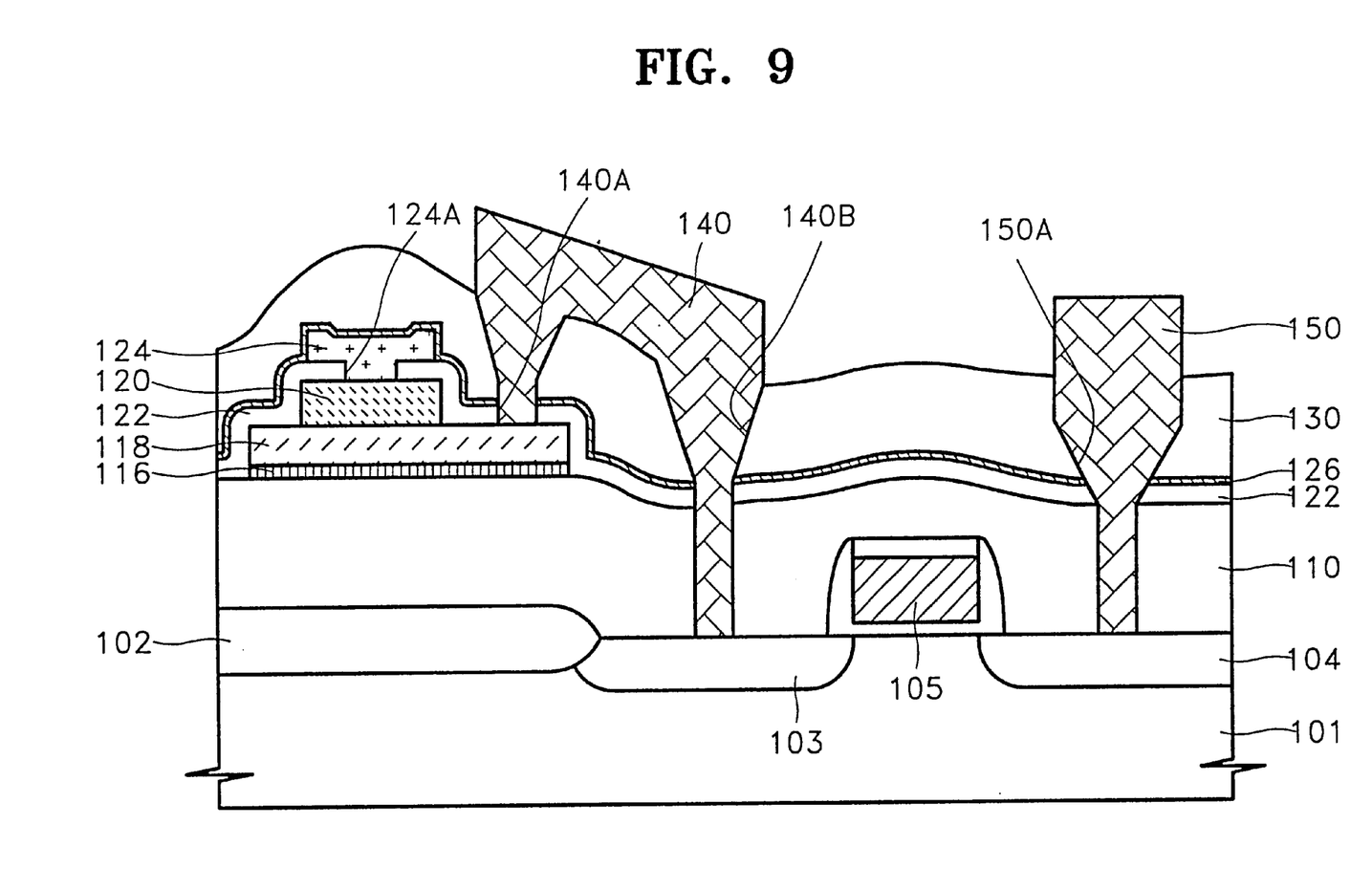
Figure 10:
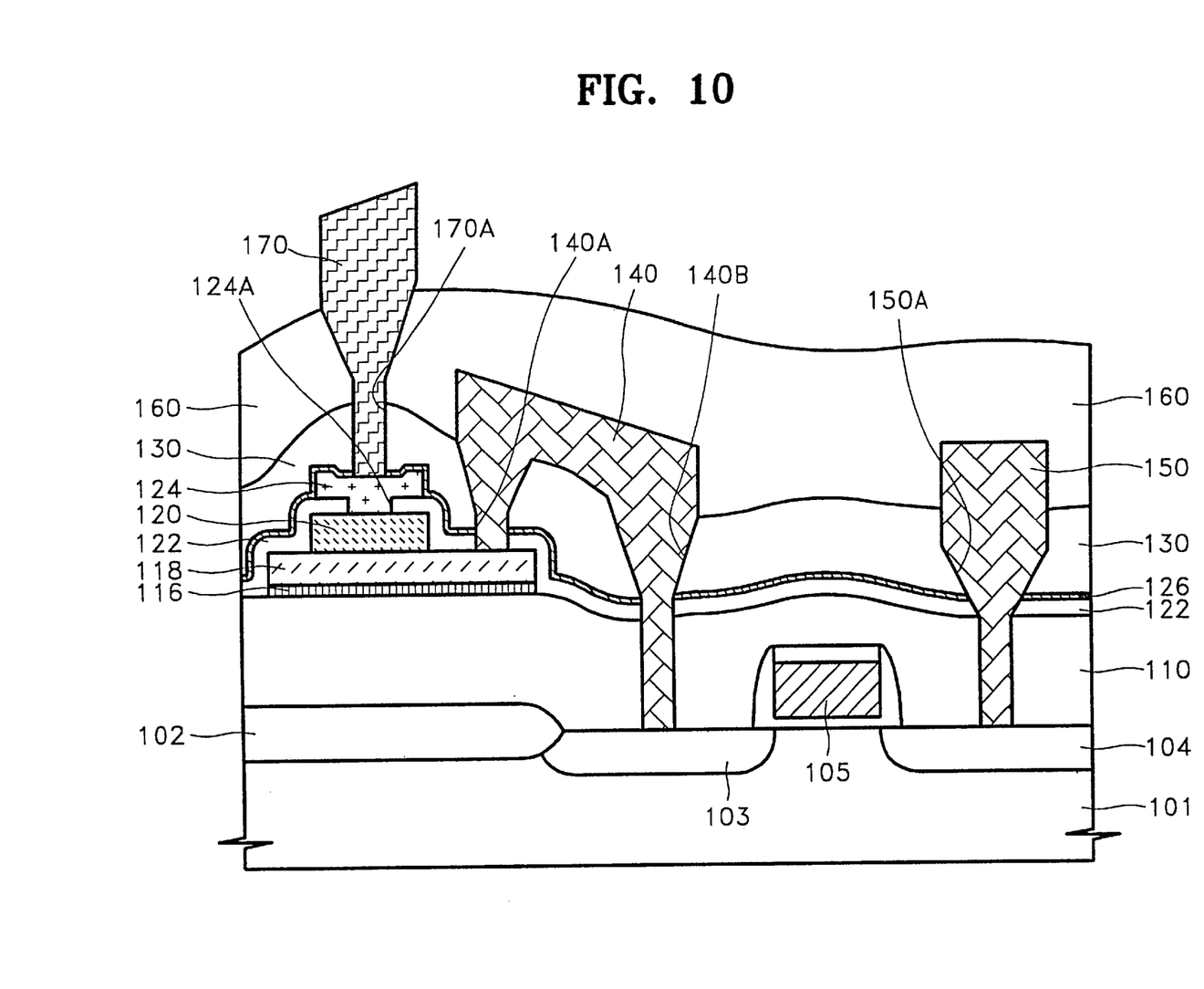

FIG. 9 is a cross-sectional view illustrating the step of forming a bit line 150 and a lower electrode wire 140. Referring to FIG. 9, the second ILD film 130 is patterned to simultaneously form a first lower electrode wire contact hole 140A partially exposing the surface of the lower electrode 118, a second lower electrode wire contact hole 140B partially exposing the source region 130, and a bit contact hole 150A partially exposing the drain region 104. Then, after forming a first metal layer to fill the first and second lower electrode wire contact holes 140A and 140B and the bit contact hole 150A, the structure is patterned to simultaneously form a lower electrode wire 140 for electrically connecting the lower electrode 118 to the source region 103 and a bit line 150. An Al/TiN/Ti layer or W/TiN/Ti layer formed by sputtering may be used as the first metal layer FIG. 10 is a cross-sectional view illustrating the step of forming a plate line 170. Referring to FIG. 10, an oxide layer is formed on the entire surface of the resultant structure having the lower electrode wire 140 and the bit line 150, at a thickness of about 8,000~10,000 Å using a CVD method, thereby resulting in an inter-metal dielectric film 160. Then, the inter-metal dielectric film 160, the second ILD film 130 and the second diffusion barrier layer 126 are patterned to form a plate line contact hole 170A partially exposing the upper electrode 124. Then, a second metal layer is formed on the entire surface of the resultant structure having the plate line contact hole 170A to fill the plate line contact hole 170A, and then patterned to form a plate line 170 of a capacitor. An Al/TiN/Ti layer or W/TiN/Ti layer formed by a sputtering method may be used as the second metal layer, similar to the first metal layer.

As described above, in ferroelectric memory devices according to preferred embodiments of the present invention, the lower electrode wire which electrically connects the lower electrode of a capacitor to the source region of the semiconductor substrate is formed simultaneously with the bit line, thereby simplifying the fabrication process.

Also, an adhesion reinforcing layer is formed between the lower electrode of the ferroelectric capacitor and the first ILD film, and a diffusion barrier layer is formed between the ferroelectric layer pattern of the ferroelectric capacitor and the upper electrode. The diffusion barrier layer prevents diffusion of constituent material of the ferroelectric pattern into the ILD films and also improves the adhesion between electrodes of the capacitor and the ILD films or the ferroelectric layer pattern and electrodes. Accordingly, the reliability of the memory devices can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit ferroelectric memory device comprising:

an integrated circuit substrate including an elongated active region therein;

a pair of spaced apart word lines which cross the elongated active region;

a drain region in the elongated active region between the pair of word lines;

a pair of source regions in the elongated active region, a respective one of which is outside the pair of spaced apart word lines on opposite sides of the drain region;

a first interlayer dielectric layer on the integrated circuit substrate and the pair of spaced apart word lines;

a pair of ferroelectric capacitors outside the elongated active region, a respective one of which is adjacent a respective one of the pair of source regions, each of the ferroelectric capacitors comprising spaced apart first and second electrode layers that are adjacent to and remote from the integrated circuit substrate, respectively, and a ferroelectric layer therebetween, each ferroelectric layer including first and second opposing faces, the first face being adjacent the first electrode layer and the second face being adjacent the second electrode layer, and a sidewall extending between the first and second opposing faces, the first electrode layers of the pair of ferroelectric capacitors being spaced apart from one another and the second electrode layers of the pair of ferroelectric capacitors being spaced apart from one another;

a first diffusion barrier layer directly on each of the ferroelectric layer sidewalls and directly on each of the ferroelectric layer second faces, the first diffusion barrier layer having a first pair of contact holes and a second pair of contact holes therein, the respective one of the second electrode layers extending through a respective one of the first pair of contact holes to directly electrically connect to a respective one of the ferroelectric layers;

a second diffusion barrier layer directly on each of the second electrode layers, opposite the ferroelectric layer, and directly on the first diffusion barrier layer, the second diffusion barrier layer having a third pair of contact holes and a fourth pair of contact holes therein;

a second interlayer dielectric layer on the second diffusion barrier layer;

a bit line that extends from the second interlayer dielectric layer through the second diffusion barrier layer, the first diffusion barrier layer, and the first interlayer dielectric layer to electrically connect to the drain region;

a pair of lower electrode wires, a respective one of which electrically connects a respective one of the first electrode layers to a respective one of the pair of source regions, the respective one of the pair of lower electrode wires extending from the second interlayer dielectric layer through a respective one of the second pair of contact holes and a respective one of the fourth pair of contact holes to electrically connect to the respective one of the first electrode layers, and the respective one of the pair of lower electrode wires extending from the second interlayer dielectric layer through the second diffusion barrier layer, the first diffusion barrier layer, and the first interlayer dielectric layer to electrically connect to the respective one of the pair of source regions;

a third interlayer dielectric layer on the second interlayer dielectric layer, the pair of lower electrode wires, and the bit line; and a pair of plate lines, a respective one of which extends from the third interlayer dielectric layer through the second interlayer dielectric layer and a respective one of the third pair of contact holes to electrically connect to the respective one of the second electrode layers;

wherein the pair of plate lines and the pair of word lines extend parallel to each other and perpendicular to the bit line.

2. An integrated circuit ferroelectric memory device according to claim 1 further comprising an adhesion reinforcing layer beneath the first electrode layers.

3. An integrated circuit ferroelectric memory device according to claim 2 wherein the first electrode layers comprise material selected from the group consisting of platinum, indium tin oxide, rhenium oxide, ruthenium oxide and molybdenum oxide.

4. An integrated circuit ferroelectric memory device according to claim 3 wherein the adhesion reinforcing layer comprises titanium.

5. An integrated circuit ferroelectric memory device according to claim 4 wherein the ferroelectric layers comprise material selected from the group consisting of PZT and PLZT.

6. An integrated circuit ferroelectric memory device according to claim 5 wherein the second electrode layers comprise material selected from the group consisting of platinum, indium tin oxide, rhenium oxide, ruthenium oxide and molybdenum oxide.

7. An integrated circuit ferroelectric memory device according to claim 6 wherein the pair of bit lines and the pair of lower electrode wires comprise a first metal layer.

8. An integrated circuit ferroelectric memory device according to claim 7 wherein the first metal layer comprises material selected from the group consisting of a W/TiN/Ti layer and an Al/TiN/Ti layer.

9. An integrated circuit ferroelectric memory device according to claim 8 wherein the pair of plate lines comprises material selected from the group consisting of a W/TiN/Ti layer and an Al/TiN/Ti layer.

10. An integrated circuit ferroelectric memory device comprising:

an integrated circuit substrate including an active region therein;

a word line which crosses the active region;

spaced apart source and drain regions in the active region, a respective one of which is on opposite sides of the word line;

a first interlayer dielectric layer on the integrated circuit substrate and the word line;

a ferroelectric capacitor outside the active region, adjacent the source region, the ferroelectric capacitor comprising spaced apart first and second electrode layers that are adjacent to and remote from the integrated circuit substrate, respectively, and a ferroelectric layer therebetween, the ferroelectric layer including first and second opposing faces, the first face being adjacent the first electrode layer and the second face being adjacent the second electrode layer, and a sidewall extending between the first and second opposing faces;

a first diffusion barrier layer directly on the ferroelectric layer sidewall and directly on the ferroelectric layer second face, the first diffusion barrier layer having a first contact hole and a second contact hole therein, the second electrode layer extending through the first contact hole to directly electrically connect to the ferroelectric layer;

a second diffusion barrier layer directly on the second electrode layer, opposite the ferroelectric layer, and directly on the first diffusion barrier layer, the second diffusion barrier layer having a third contact hole and a fourth contact hole therein;

a second interlayer dielectric layer on the second diffusion barrier layer;

a bit line that extends from the second interlayer dielectric layer through the second diffusion barrier layer, the first diffusion barrier layer, and the first interlayer dielectric layer to electrically connect to the drain region;

a wiring layer that electrically connects the first electrode layer to the source region, the wiring layer extending from the second interlayer dielectric layer through the second contact hole and the fourth contact hole to electrically connect to the first electrode layer, and the wiring layer extending from the second interlayer dielectric layer through the second diffusion barrier layer, the first diffusion barrier layer, and the first interlayer dielectric layer to electrically connect to the source region;

a third interlayer dielectric layer on the second interlayer dielectric layer, the wiring layer, and the bit line; and a plate line that extends from the third interlayer dielectric layer through the second interlayer dielectric layer and the third contact hole to electrically connect to the second electrode layer;

wherein the plate line and the word line extend parallel to each other and perpendicular to the bit line.

11. An integrated circuit ferroelectric memory device according to claim 10 further comprising an adhesion reinforcing layer beneath the first electrode layer.

12. An integrated circuit ferroelectric memory device according to claim 11 wherein the first and second electrode layers comprise material selected from the group consisting of platinum, indium tin oxide, rhenium oxide, ruthenium oxide and molybdenum oxide.

13. An integrated circuit ferroelectric memory device according to claim 12 wherein the adhesion reinforcing layer comprises titanium.

14. An integrated circuit ferroelectric memory device according to claim 13 wherein the ferroelectric layer comprises material selected from the group consisting of PZT and PLZT.

15. An integrated circuit ferroelectric memory device according to claim 14 wherein the bit line and wiring layer comprise material selected from the group consisting of a W/TiN/Ti layer and an Al/TiN/Ti layer.

16. An integrated circuit ferroelectric memory device according to claim 1 wherein the pair of plate lines extend onto the third interlayer dielectric layer opposite the second interlayer dielectric layer, the bit line extends onto the second interlayer dielectric layer beneath the third interlayer dielectric layer, and the pair of lower electrode wires extend onto the second interlayer dielectric layer beneath the third interlayer dielectric layer.

17. An integrated circuit ferroelectric memory device according to claim 10 wherein the plate line extends onto the third interlayer dielectric layer opposite the second interlayer dielectric layer, the bit line extends onto the second interlayer dielectric layer beneath the third interlayer dielectric layer, and the wiring layer extends onto the second interlayer dielectric layer beneath the third interlayer dielectric layer.

* * * * *